(12) United States Patent
Marmaropoulos et al.

(10) Patent No.: US 6,646,336 B1
(45) Date of Patent: Nov. 11, 2003

(54) WEARABLE SILICON CHIP

(76) Inventors: George Marmaropoulos, 2145-B Saw Mill River Rd., Yorktown Heights, NY (US) 18594; Clive R. Van Heerden, 5922 Liebbs Ave., Riverdale Bronx, NY (US) 16473

( * ) Notice: Subject to any disclaimer, the term of this patent is extended or adjusted under 35 U.S.C. 154(b) by 0 days.

(21) Appl. No.: 10/184,510

(22) Filed: Jun. 28, 2002

(51) Int. Cl.⁷ .............................................. H01L 23/04
(52) U.S. Cl. ....................................... 257/698; 257/730
(58) Field of Search ................................ 257/698, 730, 257/678

(56) References Cited

U.S. PATENT DOCUMENTS

| | | | |
|---|---|---|---|
| 5,592,408 A | * | 1/1997 | Keskin et al. ................ 365/52 |
| 5,608,265 A | * | 3/1997 | Kitano et al. ................ 257/738 |
| 6,097,607 A | * | 8/2000 | Carroll et al. ............... 361/752 |
| 6,180,881 B1 | * | 1/2001 | Isaak .......................... 174/52.4 |
| 6,342,726 B2 | * | 1/2002 | Miyazaki et al. ............ 257/668 |
| 6,393,745 B1 | * | 5/2002 | Miki ............................ 40/586 |

* cited by examiner

Primary Examiner—Hoai Ho
Assistant Examiner—Tu-Tu Ho
(74) Attorney, Agent, or Firm—Aaron Waxler

(57) ABSTRACT

A semiconductor chip package and method of providing same including a semiconductor die, an insulating package body encapsulating the semiconductor die, and an aperture extending through and between opposing sides of the package body, wherein at least a portion of an inner surface of the aperture is electrically connected to the semiconductor die.

17 Claims, 3 Drawing Sheets

WEARABLE SILICON CHIP

BACKGROUND OF THE INVENTION

1. Field of the Invention

The present invention relates to a semiconductor chip device, and particularly to packaging of a semiconductor and integrated circuit capable of being attached to fabric.

2. Description of the Related Art

While there has been an increasing need for faster operating semiconductor chips and integrated circuits (ICs), there has also been a need for a semiconductor chip packaged in a smaller form factor in order to achieve higher mounting density. Thus, smaller packaged semiconductor chips having less rigid, thinner, and smaller pitch external leads have been manufactured. A negative consequence of semiconductor chips having less rigid, thinner, and smaller pitch external leads is that the leads are less robust and require greater alignment accuracy for testing and coupling purposes.

FIG. 1 depicts a conventional semiconductor chip 100 including a lead frame for supporting a semiconductor die 105 and a plurality of metallic leads having an inner lead portion 110 and an outer lead portion 115. Semiconductor die 105 has a plurality bonding pads (not shown), each electrically interconnected to one of the inner lead portions of the plurality of leads by an internal bonding wire 120. Each outer lead portion 115 of the plurality of leads corresponds to a pin of semiconductor chip 100 and is provided for coupling semiconductor chip 100 to an external circuit. Semiconductor die 105, inner lead portions 110, and internal bonding wire 120 are encapsulated in an insulating capsule 125 while outer lead portions 115 are disposed external to insulating capsule 125. Capsule 125 is typically manufactured of an insulating plastic or epoxy.

Metal conductive external leads such as those depicted in FIG. 1 are suitable for providing conventional electrical connections, that is, being coupled to another rigid metallic (i.e., conductive) surface. However, due in part to an increase in processing power and decreases in size and manufacturing costs of semiconductor chips, semiconductor chips are being incorporated into an increasing variety of applications. In order to adapt to some applications, there is an increasing desire to mount semiconductor chips and devices onto a less than rigid mounting surface. One example of an application where the mounting surface for the chip is not rigid includes a semiconductor chip or IC incorporated into the fabric of an article of clothing.

Thus, there exists a need for a method and system of providing a semiconductor or IC having packaging capable of being attached to variable surface, such as an article of fabric clothing.

SUMMARY OF THE INVENTION

It is an object of the present teachings to provide a semiconductor chip providing attachment to a variable surface.

It is another object of the present teachings to provide a semiconductor having a package body including an aperture therethrough.

In accordance with the present teachings, there is provided a method, apparatus, and storage medium for providing a semiconductor chip package including a semiconductor die, an insulating package body encapsulating the semiconductor die, and an aperture extending through and between opposing sides of the package body, wherein at least a portion of an inner surface of the aperture is electrically connected to the semiconductor die.

The above and other objects, advantages, and benefits of the present invention will be understood by reference to following detailed description and appended sheets of drawings.

BRIEF DESCRIPTION OF THE DRAWINGS

The above set forth and other features of the present teachings are made more apparent in the ensuing Detailed Description of the Invention when read in conjunction with the attached Drawings, wherein.

DETAILED DESCRIPTION OF THE INVENTION

Figure 1:
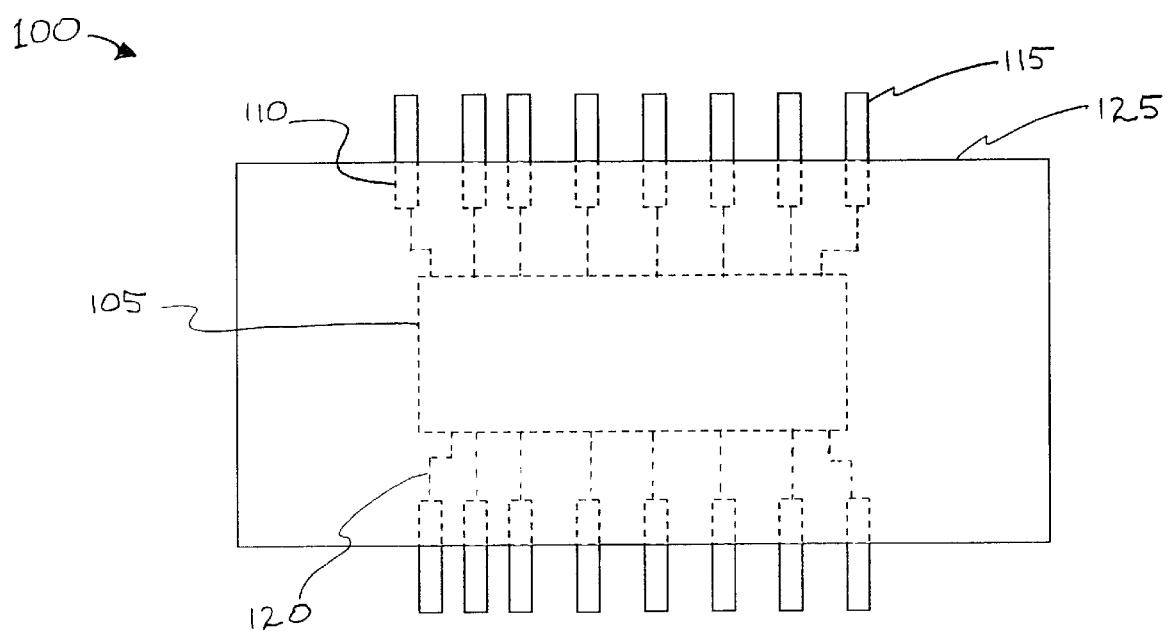
FIG. 1 is an exemplary depiction of a semiconductor chip configuration of the prior art.
Figure 2A:
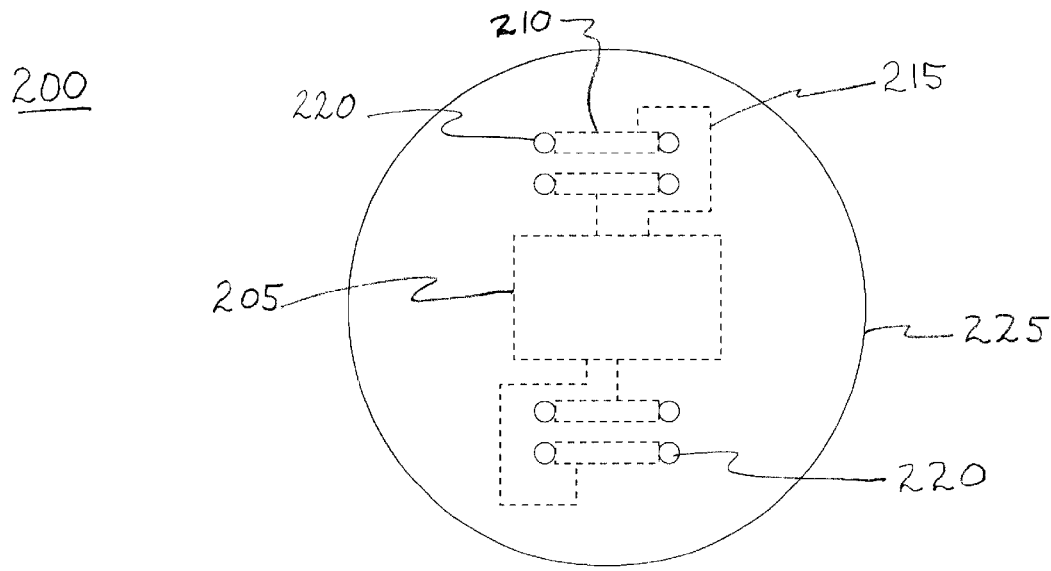
FIG. 2A is an exemplary plan view depiction of a semiconductor chip package in accordance with the teachings of the present invention.
Figure 2B:
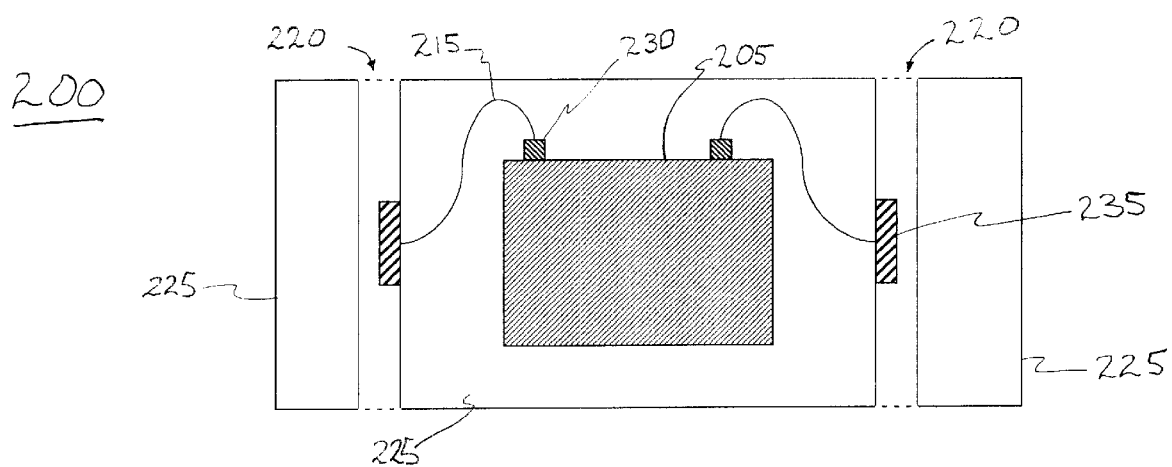
FIG. 2B is an exemplary cross section of the semiconductor chip package of FIG. 2A.

Referring to the figures, and in particular to FIGS. 2A and 2B, there is depicted an exemplary representation of a semiconductor chip package 200 in accordance with the teachings of the present invention. Note that certain aspects of semiconductor chip package 200 are shown in dashed lines to indicate that they are not visible since they are preferably encapsulated in package body 225.

In an aspect of the present invention, semiconductor chip package 200 includes a semiconductor die 205. Semiconductor die 205 may be affixed, if at all, to package body 225 by an adhesive tape, paste, or any other suitable method employed in the manufacture of a semiconductor chip. Package body 225 encapsulates semiconductor die 205. Package body 225 is preferably manufactured of an insulating material such as an epoxy or plastic. As should be recognized by those skilled in the art, the particular material forming package body 225 may be varied according to the manufacturing process and intended application of semiconductor chip package 200.

Semiconductor die 205 can include a single discrete device such as, for example, a bipolar transistor, a FET, and a diode. Semiconductor chip 205 can also implement an IC such as, for example and not as a limitation thereof, an amplifier, a filter, a monitoring device, a sensor, a radio, and a telephone. The particular component or IC implemented by semiconductor 205 may comprise all semiconductor devices and ICs suitable and applicable with the teachings of the present invention.

Semiconductor chip 200 includes at least one aperture 220 in package body 225. Aperture 220 extends through package body 225 extending between and terminating at opposing sides of package body 225. This aspect of the present invention is most readily seen by reference to FIG. 2B depicting a cross-sectional view of semiconductor chip package 200.

In an aspect of the present invention, at least a portion of aperture 220 is electrically connected to semiconductor die 205. In the exemplary embodiment of FIGS. 2A and 2B, a boding wire 215 connects a conductive portion of an inner surface of aperture 220 to semiconductor die 205. Conductive element 235 facilitates the electrical coupling of aperture 220 and semiconductor die 205. Conductive element 235 is disposed on at least a portion of an inner surface of aperture 220. Conductive element 235 may include a conductive coating layer, a conductive connector, and a conductive interface.

Bonding pad 230 provides an electrical connection point to semiconductor die 205. Bonding pad 230 thus provides an electrical connection point for one end of bonding wire 215, the other end of which is connected to conductive element 235. It will be appreciated by those skilled in the art that bonding pad 230 may be formed by any of the known and applicable semiconductor manufacturing processes.

It should be appreciated that conductive element 235 may extend the entire height of aperture 235, that is, from one side of package body 225 to the opposing side of package body 225. Conductive element 225 may include multiple conductive components, each located near the end openings of aperture 220.

In an aspect of the present invention, the conductive element(s) 235 of semiconductor chip package 200 are not disposed on an exterior surface of semiconductor chip package 200. That is, connection points or leads of semiconductor chip package 200 are preferably neither disposed on nor extending from the exterior surface of package body 225. Accordingly, there are no leads external to package body 225, subject to bending and/or breakage.

In an aspect of the invention hereof, the conductive coating layer, conductive connector, conductive interface or other applicable conductor comprising conductive element 235 is contacted by a conductor disposed in aperture 220. In this manner, an conductor external to semiconductor chip package 200 disposed in aperture 220 and contacting conductive element 235 is electrically coupled to semiconductor die 205.

In another aspect of the present invention, semiconductor chip package 200 has a plurality of apertures 220 wherein more than one of the plurality of apertures are electrically coupled together to form a common connection point to semiconductor die 205. As seen in FIG. 2A, two apertures 220 (i.e., a pair) are connected to each other by a conductive connector 210. Thus, each of the apertures 220 forming a pair of connected apertures provide as a common connection point. This aspect of the present teachings provides flexibility of use and application to semiconductor chip package 200.

It should be appreciated that the interconnection of apertures 220 can include other interconnection schemes other than that depicted in FIGS. 2A and 2B. The illustrated aperture locations, configuration, numbers, interconnections between apertures 220 and semiconductor die 205 are illustrative of the teachings herein, not limitations thereof. Aperture 220 interconnections illustrated in FIG. 2A, for example, demonstrate an exemplary and concise interconnection scheme simplified for illustrative purposes and understanding of the present invention.

Figure 3:
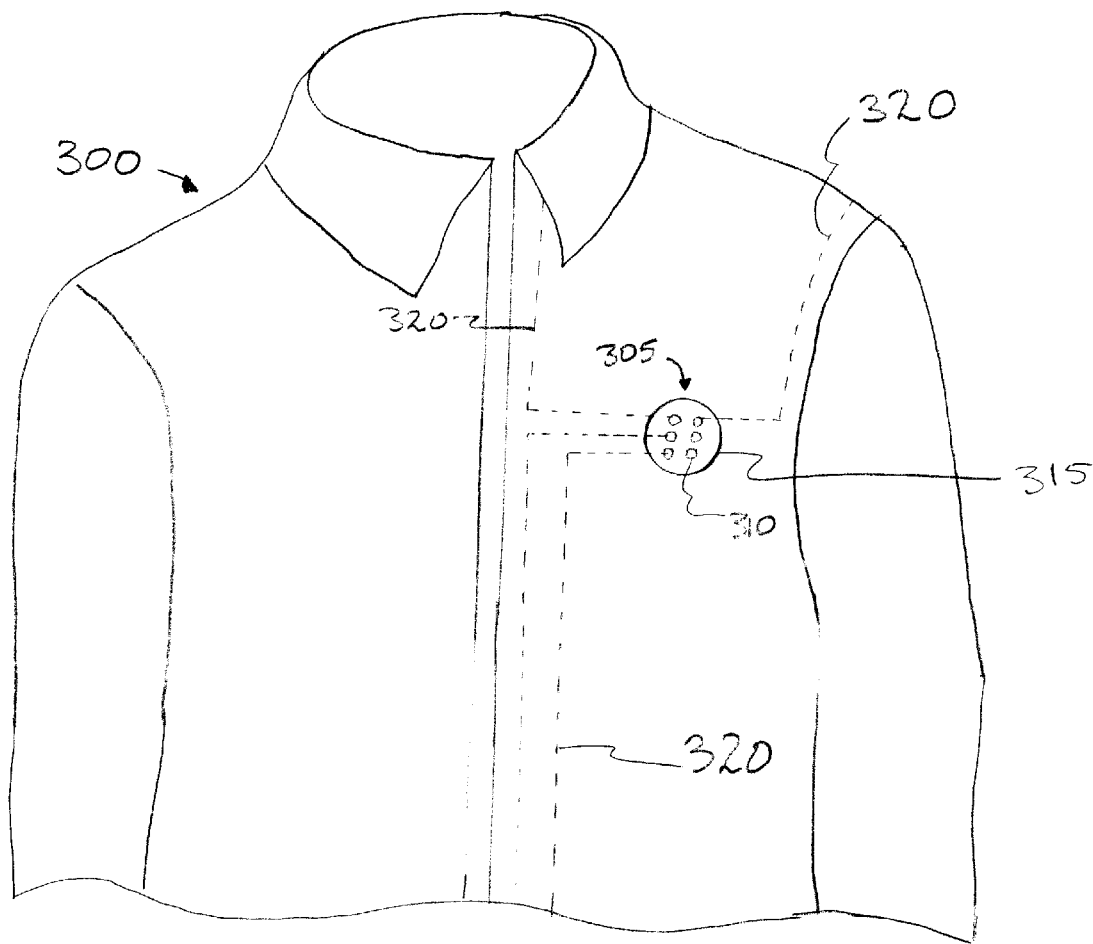
FIG. 3 is an exemplary depiction of a semiconductor chip integrated in an article of fabric clothing, in accordance with the teachings of the present invention.

Regarding FIG. 3, there is depicted an exemplary semiconductor chip package 305 integrated in an article of fabric clothing, both synthetic and natural, in accordance with the teachings of the present invention. As shown, semiconductor chip package 305 is attached to the article of clothing, namely shirt 300. By way of apertures 310 that extend through semiconductor chip package body 315 in a manner similar to that discussed above regarding FIGS. 2A and 2B, semiconductor chip package 305 can be attached to shirt 300. The methods and processes of attaching semiconductor chip package 305 to shirt 300 may thus include both manual and automatic process used in the manufacture and assembly of clothing.

Semiconductor chip package 305 can be connected to circuits and devices attached to and integrated into an article of clothing. For example, semiconductor chip package 305 can be attached to shirt 300 using conductive thread. The conductive thread can be interwoven into shirt 300 to connect semiconductor chip package 305 to conductive fiber tracks 320. Conductive fiber tracks 320 are preferably integrated in the fabric of shirt 300 to provide a signal trace from semiconductor chip package 305 to other semiconductor chip packages, circuits, and devices. Accordingly, semiconductor chip package 305 can be incorporated into a article of clothing and connected to circuits and devices integrated therein.

In an aspect of the present teachings, a method of packaging a semiconductor chip in accordance with the present invention is provided. The method of packaging the semiconductor chip package may include the steps of affixing a semiconductor die to a insulating package body, forming at least one aperture that passes through and between opposing sides of the package body, electrically connecting at least a portion of an inner surface of the aperture to the semiconductor die, and encapsulating the semiconductor die in the package body. Other steps that may be provided include, for example, disposing a bonding pad in communication with the semiconductor die, electrically connecting a portion of the inner surface of the aperture to the bonding pad, and electrically coupling the semiconductor chip package to an external device or circuit by a conductive thread.

It should be appreciated by those skilled in the art that the system environment, i.e., an article of clothing, semiconductor die 205, 305, aperture 220, 310 and other aspects of the teachings herein are but examples of implementations suitable for the semiconductor chip package of the present teachings, and thus do not limit the scope or variety of applications that the present invention may be suitably implemented. Thus, it should be understood that the foregoing description is only illustrative of a present implementation of the teachings herein. Various alternatives and modification may be devised by those skilled in the art without departing from the invention. For example, semiconductor chip package 200 may be provided as discussed above and attached to and incorporated into a variable surface other than cloth fabric such as paper and cardboard.

Accordingly, the present invention is intended to embrace all such alternatives, modifications, and variances which fall within the scope of the appended claims.

What is claimed is:

1. A semiconductor chip package comprising:
   a semiconductor die;
   an insulating package body encapsulating said semiconductor die; and
   an aperture extending through and between opposing sides of said insulating package body, wherein at least a portion of an inner surface of said aperture is conductive, electrically connected to said semiconductor die, and electrically cooperative with one or more conductive threads.

2. The semiconductor chip package of claim 1, wherein said semiconductor die comprises a conductive bonding pad in communication with said semiconductor die.

3. The semiconductor chip package of claim 1, comprising a bonding wire electrically connecting said portion of the inner surface of said aperture electrically to said semiconductor die.

4. The semiconductor chip package of claim 1, wherein said semiconductor chip package is connectable to an external device or circuit via said one or more conductive threads.

5. The semiconductor chip package of claim 1, comprising an electrically conductive connector between at least two of said aperture.

6. The semiconductor chip package of claim 5, wherein said at least two apertures comprise a common electrical contact for said semiconductor chip package.

7. The semiconductor chip package of claim 1, wherein said semiconductor chip comprises an integrated circuit.

8. The semiconductor chip package of claim 1, wherein said conductive portion of said aperture is in said aperture and not external to an exterior surface of said package body.

9. A method of packaging a semiconductor chip comprising:

encapsulating a semiconductor die in a insulating package body;

forming an aperture passing through and between opposing sides of said package body, said aperture having one or more conductive portions electrically cooperative with one or more conductive threads; and electrically connecting at least one of said one or more conductive portions to said semiconductor die.

10. The method of claim 9, comprising forming a plurality of apertures in said package housing.

11. The method of claim 9, comprising disposing a bonding pad in communication with said semiconductor die.

12. The method of claim 11, comprising electrically connecting at least one of said one or more conductive portions to said bonding pad.

13. The method of claim 9, comprising electrically connecting said semiconductor chip package to an external device or circuit via said one or more conductive threads.

14. The method of claim 9, comprising electrically connecting at least two of said aperture.

15. The method of claim 9, wherein said semiconductor chip comprises an integrated circuit.

16. The method of claim 9, wherein said conductive portion of said aperture is in said aperture and not external to an exterior surface of said package body.

17. A semiconductor chip package comprising:

at least one semiconductor die;

at least one insulating body encapsulating said at least one semiconductor die; and two or more apertures extending through and between opposing sides of said at least one insulating body, wherein at least a portion of an inner surface of at least one of said two or more apertures is conductive, electrically connected to said at least one semiconductor die, and electrically cooperative with one or more conductive threads.

* * * * *

UNITED STATES PATENT AND TRADEMARK OFFICE
CERTIFICATE OF CORRECTION

PATENT NO.    : 6,646,336 B1
DATED         : November 11, 2003
INVENTOR(S)   : Marmaropoulos et al.

It is certified that error appears in the above-identified patent and that said Letters Patent is hereby corrected as shown below:

<u>Title page,</u>
Insert item:
-- [73] Assignee: Koninklijke Philips Electronics N.V., Eindhoven (NL) --.

Signed and Sealed this

Thirtieth Day of March, 2004

JON W. DUDAS
*Acting Director of the United States Patent and Trademark Office*